United States Patent [19]

Stengel

[11] Patent Number: 5,442,317
[45] Date of Patent: Aug. 15, 1995

[54] SWITCHING REGULATOR AND AMPLIFIER SYSTEM

[75] Inventor: Robert E. Stengel, Ft. Lauderdale

[73] Assignee: Motorola, Inc., Schaumburg, Ill.

[21] Appl. No.: 402,759

[22] Filed: Mar. 10, 1995

Related U.S. Application Data

[63] Continuation of Ser. No. 269,944, Jun. 29, 1994, abandoned, which is a continuation of Ser. No. 974,017, Nov. 10, 1992, abandoned.

[51] Int. Cl.6 .............................................. H03F 3/38
[52] U.S. Cl. ..................... 330/10; 330/146; 330/297
[58] Field of Search ................. 330/10, 146, 202, 297

[56] References Cited

U.S. PATENT DOCUMENTS

| | | | |
|---|---|---|---|
| 3,829,788 | 8/1974 | Ford | 330/10 |
| 4,016,501 | 4/1977 | Jasinski et al. | 330/10 |
| 4,586,002 | 4/1986 | Carver | 330/297 |
| 4,717,889 | 1/1988 | Engelman | 330/297 |
| 4,742,311 | 5/1988 | Van Der Zwart | 330/297 |
| 4,752,747 | 6/1988 | Butti et al. | 330/297 |
| 5,075,634 | 12/1991 | French | 330/10 X |

OTHER PUBLICATIONS

Motorola Semiconductor—Master Selection Guide 1992 (Rev 5)—Cover pages, p. 5.3-7, copyright 1992.

*Primary Examiner*—James B. Mullins
*Attorney, Agent, or Firm*—Pedro P. Hernandez; M. Mansour Ghomeshi

[57] ABSTRACT

A voltage regulator (200) includes a controller (204) which selectively activates a plurality of switching means (208, 210, 214, and 212) in order to select between a first current loop in which an energy storage device is charged by an input supply and a second loop in which the energy storage device is coupled to the output terminal (242) of the regulator (200). The switching from the second current loop to the first is governed by the controller (204) determining that the loop current in the second loop has reached a predetermined level. A first switching audio amplifier (300) is disclosed which uses the voltage regulator (200) to provide a continuously variable output voltage (318) in order to provide for high quality amplification which is independent of the volume setting. A second audio amplifier (400)includes a converter (436) which provides discrete voltage levels to a full wave bridge in order to provide improved audio output.

18 Claims, 5 Drawing Sheets

SWITCHING REGULATOR AND AMPLIFIER SYSTEM

This is a File Wrapper Continuation of U.S. patent application Ser. No. 08/269,944 filed on Jun. 29, 1994, and now abandoned, which was a file wrapper continuation of U.S. Ser. No. 07/974,017 filed on Nov. 10, 1992, and now abandoned.

TECHNICAL FIELD

This invention relates generally to switching voltage regulators and more specifically to an audio amplifier which uses a switching voltage regulator.

BACKGROUND

Figure 1:
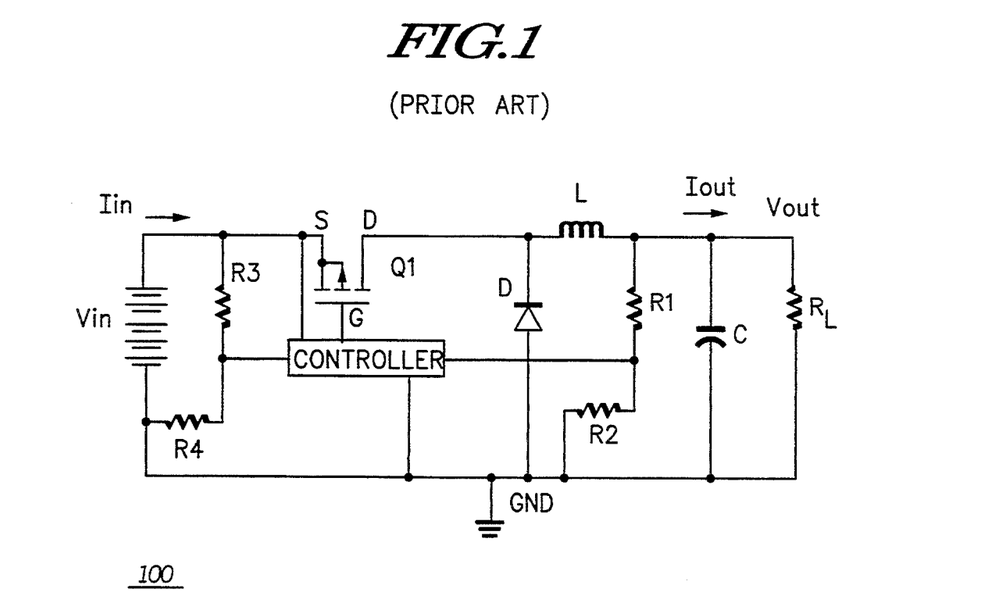
FIG. 1 is a diagram of a prior art step down switching voltage regulator.

As the input and output voltages in a step-down switching voltage regulator get closer in voltage level, the voltage potential across the energy storage inductor of the regulator decreases, causing the inductors rate of energy storage to decrease. Referring to FIG. 1, there is shown a prior art step-down switching voltage regulator 100. Current flows in regulator 100 from the battery (Vin), through inductor (L) and then to the load components, capacitor (C) and resistor (R), when transistor switch (Q1) is "on" (activated). When transistor switch (Q1) is "off" (deactivated), diode (D) conducts, maintaining a current loop with inductor (L) and load (R) until transistor (Q1) is turned "on". Once transistor (Q1)is turned "on", diode (D) is biased "off" again. The controller used in voltage regulator 100 controls the duty cycle (the rate at which the transistor is turned on and off) of transistor Q1 in order to maintain a constant output voltage to the load (R). The divider circuit formed by resistors R1 and R2 is used to inform the controller the output voltage level, while the divider formed by R3 and R4 is used to inform the controller the voltage level of the input voltage source.

The problems encountered with the prior art voltage regulator shown in FIG. 1 are several, as previously discussed, the amount of energy storage which is achieved by inductor (L)is dependent on both the input and output voltages of the regulator. Also, the commutating diode (D) being a fairly high dissipation device (approximately providing for a 0.5 volt voltage drop), takes away much of the circuits efficiency during the time transistor (Q1) is turned "off", especially as Vout gets lower in voltage level and the voltage drop across diode (D) becomes a larger percentage of the overall voltage drop in the loop. A need thus exists for a switching voltage regulator which is dependent only on the input voltage level and which can provide for lower output voltage levels.

In switching audio amplifier systems as the audio volume setting and the battery supply voltage vary, the efficiency of the amplifier also varies. Variable supply speaker loads exist in the field of audio amplifiers, however they require a transformer to move both terminals of the speaker load about a ground reference as taught in U.S Pat. No. 4,445,095, entitled "Audio Amplifier", by Robert W. Carver. The addition of a transformer adds both expense and increases the size of the audio amplifier circuit. A need exists for an audio amplifier system which provides for substantially constant efficiency over varying voltage and volume settings without the need for the use of a transformer.

DETAILED DESCRIPTION OF THE PREFERRED EMBODIMENT

Figure 2:
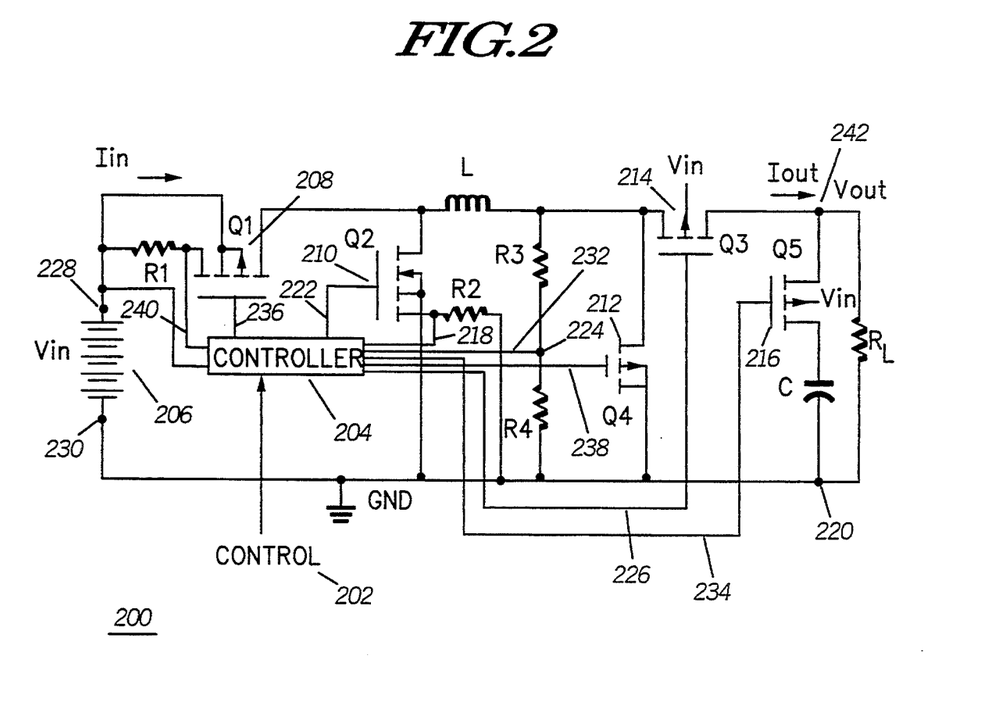
FIG. 2 is a diagram of a switching voltage regulator in accordance with the present invention.

Referring now to the drawings, and particularly to FIG. 2, there is shown a step-down switching voltage regulator 200 in accordance with the present invention. Regulator 200 receives an input voltage at first 228 and second 230 input voltage terminals. The input voltage can come from a standard voltage source such as a battery or other commonly used energy source. Regulator 200 utilizes a switching means such as an N-channel TMOS ® SENSEFET (Q2) 210 as the commutating device. Transistor (Q2) 210 is a power MOSFET having the built-in capability of being able to sense the transistor's drain current by measuring a small portion of the total transistor drain current. The use of transistor 210 provides for a way of determining when the commutating current in the loop comprised of inductor (L), load ($R_L$), transistor (Q3) 214, and transistor 210 goes to zero, thereby allowing for the regulator switching to be controlled by the loop current. Transistor 210 also provides for less voltage drop in the loop than a diode.

A signal, preferably in the form of a voltage level, is provided via line 218 from transistor 210 to one of the input terminals of controller 204. The voltage signal informs controller 204 of the amount of current flowing in the previously mentioned current loop comprising of inductor (L), load ($R_L$), and transistors 214 and 210. By the time the current in the loop reaches zero, the energy stored in inductor (L) has been either stored in capacitor (C) or dissipated by load ($R_L$). Upon controller 204 determining that the current in the loop has reached approximately zero, transistors 210 and 214 are turned off (switched open) by controller 204 via lines 222 and 226.

Saturated switch 210 provides for a lower voltage drop and higher efficiency, especially at low output voltages, as compared to using a commutating diode as shown in FIG. 1. A lower voltage drop across the commutating device (transistor 210), allows for an output voltage which can reach below two volts with a DC to DC efficiency of greater than 50%.

The rate of power stored by inductor (L) in FIG. 2, is determined by the following relationship:

$$P_J(t) = V_i(t) = \frac{V^2}{R}(1 - e^{-\frac{Rt}{L}})^2$$

where:
R=total resistance in current loop
L=inductance in Henries
V=voltage potential across the inductor t=time transistor (Q2) is in the "ON" (activated) state.

For a given value of (L) and (t), the rate of energy storage in inductor (L) can be increased by increasing the potential across the inductor and decreasing the resistance in the charging loop composed of battery 206, transistors (Q1) 208 and (Q4) 212, and inductor (L). By switching transistors 210 and 214 to the "OFF" state (not conducting) and switching transistors 208 and 212 to the "ON" state (conducting) when it is determined that the commutating current has reached zero, the potential across inductor (L) is increased to Vin and the resistance in the loop is decreased well below the resistance of the load ($R_L$). The result is an increased energy storage capacity rate and the capability of using faster switching frequencies in regulator 200.

Transistor 214 temporarily disconnects the load ($R_L$) from the inductor, while transistor 212 places one side of the inductor (L) to ground. At the same time, the other side of the inductor is coupled to the input voltage source (Vin) providing for improved energy storage rate to inductor (L).

By using the architecture of FIG. 2, energy storage into inductor (L) is dependent only on the input voltage. In addition, the switching of voltage regulator 200 is controlled by the commutating loop current and not a predetermined switching rate as in other regulator designs.

Transistor 208 is also preferably a SENSEFET transistor or other similar current sensing switch in order to allow for controller 204 to measure the amount of input current (Iin) via line 240. Resistor R1 is used in conjunction with transistor 208 to provide a voltage level at line 240 which corresponds to the amount of input current.

Resistors R3 and R4 form a voltage divider having a node 224 which is used by controller 204 via line 232 to determine the approximate Vout voltage of regulator 200 (the amount of voltage drop attributed to transistor 214 is also taken into account by controller 204). Controller 204 by monitoring node 224 can adjust the switching rate that controller 204 is switching the regulator between the commutating loop and the charging loop in order to keep the output voltage at approximately the desired level.

Controller 204 is responsible for switching the voltage regulator from the first (charging) loop consisting of battery 206, transistors 208 and 212, and inductor (L) and the second (commutating) loop consisting of inductor (L), load ($R_L$), transistor 214 and transistor 210. By being able to know exactly when the current in the second loop is approximately zero, controller 204 can quickly switch regulator 200 back to the first loop. The present invention not only provides for higher efficiencies, but also provides for a voltage regulator which is only dependent on the input voltage.

Transistor (Q5) 216 which is also under the control of controller 204 via line 234 is used in battery saving operations whereby when transistor (Q5) is placed in a non-conducting ("open") state, the charge in capacitor (C) can be maintained for longer periods of time. This is useful for battery operated devices in periods of time when the voltage regulator does not have to be operational, the charge in the capacitor (C) can be maintained until the voltage regulator begins normal operations again. An external control signal 202 can be provided to controller 204 in order to adjust the output voltage of regulator 200. A capacitor (C) is coupled in parallel to first 242 and second 220 output terminals.

The present invention provides for a voltage regulator 200 having an energy storage method dependent on the input voltage of the regulator only. In addition, the voltage regulator provides for a low dissipation commutating device with the switching controlled by the current flowing in the commutating loop. With the low voltage drop of the commutating device 210 (the SENSEFET ™) allows for a variable output voltage below two volts with a DC to DC efficiency greater than 50%. By using the voltage regulator of the present invention, battery operated devices such as portable radios can operate for longer periods of time given the improved regulation efficiency provided.

Typically, audio amplifiers employed in battery operated devices are class B bridge load amplifiers. The DC to audio sine wave power efficiency of this type of amplifier configuration is highest (approximately 78% efficiency) at the amplifier's highest power output and where the device voltage drop is lowest. For a fixed supply voltage, the DC to audio power efficiency is directly related to the audio output average voltage level. As the output voltage level decreases from the supply voltage, more power is dropped across the devices, with the maximum device dissipation occurring at 0.707 of maximum output voltage level. In addition, distortion or audio quality degrades quickly as the output level approaches the supply voltage level.

To optimize the relationship, the impedance of the speaker used in conjunction with an audio amplifier is usually chosen by the following relationship:

$$R_{speaker} = \frac{V^2}{2\,P_{audio}}$$

where:

V=supply voltage, and

P audio=maximum expected power level

In a particular example, if the expected audio power level is equal to 500 milliwatts and the supply voltage is equal to six volts, the optimum speaker impedance would equal 36 ohms.

Figure 3:
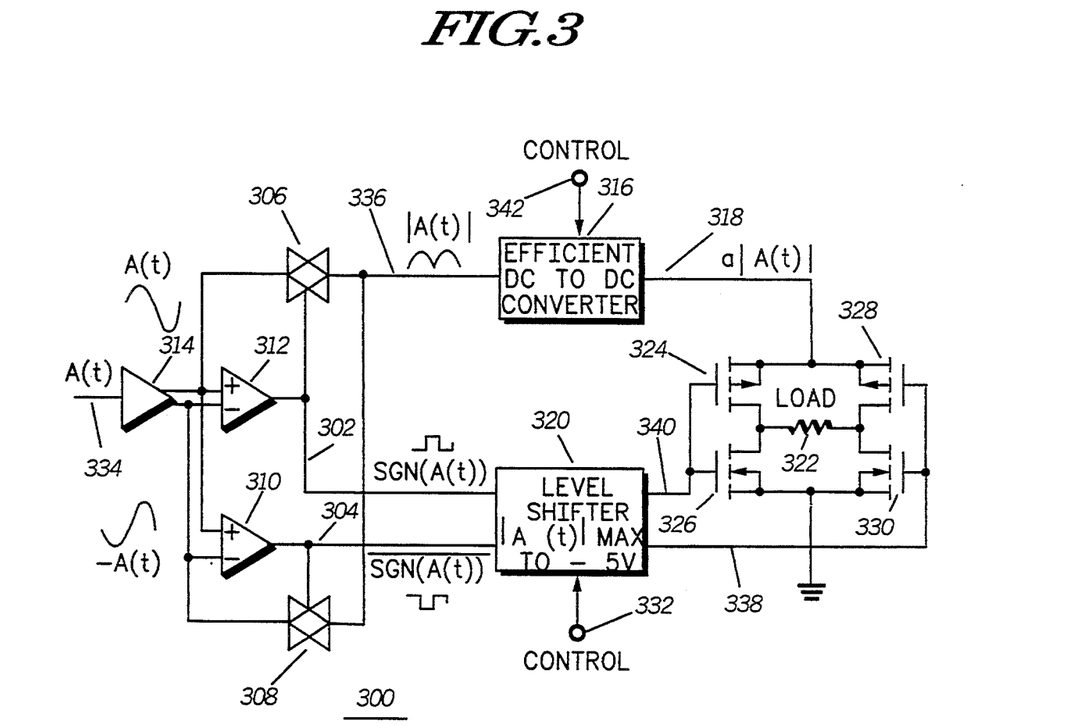
FIG. 3 is a diagram of a switching audio amplifier in accordance with the invention.

Referring to FIG. 3, there is shown a switching audio amplifier system 300 in accordance with the present invention. Audio amplifier 300 processes the input audio signal A(t) 334 and separates it into a full-wave rectified magnitude l A (t)l 336 and sine (SGN) signals of positive SGN (A(t)) 302 and negative $\overline{SGN\,(A\,(t))}$ 304 cycles. Input audio signal 334 is received by operational amplifier 314, which separates the signal into positive A(t) and negative —A(t) differential signals. The positive and negative signals are then inputted into a pair of comparators 310 and 312. Comparator 312 provides the positive cycle signal SGN (A(t)) 302, while the second comparator 310 provides the negative cycle signal $\overline{SGN\,(A\,(t))}$ 304.

Both outputs of operational amplifier 314 are sent one each to digital switches 308 and 306 which are under the control of signals 302 and 304 in order to produce the full-wave rectified magnitude signal l A (t)l 336. Operational amplifier 314, comparators 310 and 312 and switches 306 and 308 form a conversion means which converts the audio signal into a magnitude signal 336 and positive cycle 302 and negative cycle 304 signals. Those skilled in the art will appreciate that the conversion means can be implemented using a number of known hardware configurations.

Magnitude signal 336 is in turn sent to a DC to DC converter 316 such as the voltage regulator discussed in FIG. 2. Converter 316 provides an adjusted output signal "al A (t)l" 318. In effect converter 316 acts as a power amplifier having a continuously changing output signal proportional to the input signal l A (t)l 336 which is applied to impedance load 322 (e.g., a speaker). The amount of voltage change (denoted by the symbol "a" in output signal 318) which converter 316 provides to the output signal is controlled by an external control signal 342. Control signal 342 can be a signal which is dependent on the volume setting of amplifier 300, etc.

The output signal 318 coming from converter 316 is then applied to a speaker bridge network comprising of power switches such as field-effect transistors 324, 326, 328 and 330 and a load such as a speaker 322. The positive SGN (A(t)) signal 302 and negative $\overline{\text{SGN (A (t))}}$ signals 304 are in turn applied to a conventional voltage level shifting circuit 320 as known in the art. Level shifting circuit 320 preferably adjusts the level of signals 302 and 304 between a voltage range having a top rail equaling the magnitude of signal l A (t)l and a bottom rail of negative five volts. The level shifting voltage range provides "on" and "off" control of transistors 324, 326, 328, and 330 independent of the output signal level 318. Signals 340 and 338 are equivalent to 302 and 304 with levels shifted as needed. Level shifter 320 can include an optional control terminal for receiving an external control signal 332. Control signal 332 can come from the control unit (e.g., microprocessor) of the device amplifier 300 is being used in. For example, in the case amplifier 300 is being used in a communication device such as a radio, the radio's controller can adjust the amount of level shifting provided by circuit 320 by way of control signal 332. Output signal 340 of circuit 320 is applied to the transistor activation terminal on the left side of the bridge and signal 338 is applied to the transistor activation terminal on the right side of the bridge.

Output signal 318 is used to adjust the bridge network by changing the supply voltage into the bridge. While the two level shifted signals 338 and 340 are used to determine which portion of the bridge is activated. During the positive or negative portion of one conduction cycle, either the upper left 324 and lower right 330 FETs or the upper right 328 and the lower left 326 FETs are turned on. Each associated pair of FETs conduct on alternate portions of a cycle. This places the full voltage of signal 318 across the speaker 322 in a varying and alternating manner. Audio amplifier 300 provides for improvements in both dynamic range and audio distortion without the need of an isolating transformer.

Figure 4:
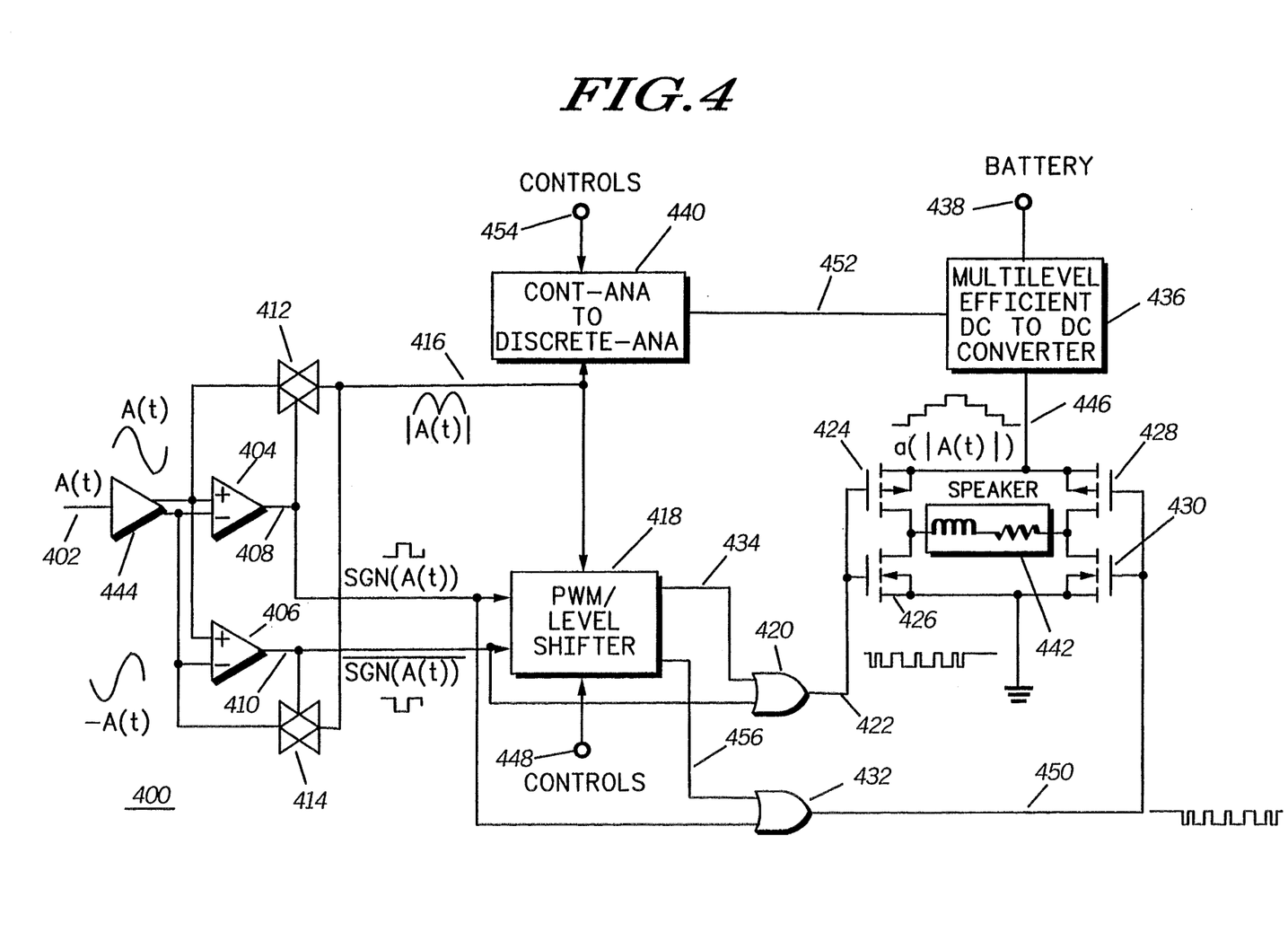
FIG. 4 is a second embodiment of a switching audio amplifier in accordance with the present invention.

In FIG. 4, another embodiment of an audio amplifier 400 in accordance with the present invention is shown. Audio amplifier 400 unlike amplifier 300 which continuously changes the input voltage 318 being sent into the full-wave bridge, amplifier 400 provides for discrete voltage levels 446 to be sent to the full-wave bridge. The discrete voltage levels are preferably dependent on the magnitude of the input audio signal 402, desired volume setting and supply voltage level 438.

In amplifier 400, as in the amplifier of FIG. 3, an audio signal 402 is presented to an operational amplifier 444 where the signal is split into positive and negative cycles. These signals are in turn fed into a network consisting of comparators 404 and 406 as well as switches 412 and 414, to produce the rectified magnitude signal 416 and positive SGN (A(t)) signal 408 and negative $\overline{\text{SGN (A (t))}}$ signal 410. The magnitude signal 416 and external signals 454 such as the audio amplifier's volume setting and supply voltage 438 are inputted into a continuous analog to discrete analog circuit 440 which takes the control signals and converts them into an output signal 452 whose voltage level depends on the input signals 416 and 454. Voltage converter circuit 436 can be designed to provide a plurality of discrete output voltage levels depending on the levels of the input signals 416 and 452. The discrete output signal 446 is in turn used to shift the supply voltage level provided to the full-wave rectified bridge.

The positive SGN (A(t)) signal 408 and negative $\overline{\text{SGN (A (t))}}$ signal 410, and the magnitude signal 416 are applied to a pulse width modulator and level shifter 418 which provides two corresponding output signals 434 and 456 which are level shifted and pulse width modulated. The amount of pulse width modulation and level shifting provided by circuit 418 is dependent on magnitude signal 416 and external control signal 448. PWM/level shifter 418 includes an input terminal for receiving external control signals 448 which come from an external device such as the control unit of the electronic device the audio amplifier is being used in. For example, if audio amplifier 400 is being used in a radio, the radio's main control unit (e.g., microprocessor) can provide an adjustment signal 448 to PWM/level shifter circuit 418 in order to adjust the amount of PWM and- /or level shifting provided. External control signals 448 can also include a supply voltage.

Output signal 434 is provided to the inputs of logic gate (AND gate) 420, while output signal 456 is applied directly to logic gate 432. The other input to logic gate 420 is negative $\overline{\text{SGN (A (t))}}$ signal 410, while the second input signal to gate 432 is positive SGN (A(t)) signal 408. The output signal 422 of gate 420 is coupled to FETs 424 and 426 while output signal 450 of logic gate 432 is coupled to FETs 428 and 430. Signals 422 and 450 determine which of the FETs are activated.

A speaker 442 represented as series coupled inductive and resistive elements, is attached between both halves of the full-wave bridge formed by FETs 424, 428, 426 and 430. As previously discussed when discussing the full-wave bridge in FIG. 3, the input to the field-effect transistors will determine which of the transistor pairs 424 and 430 or 428 and 426 will be conducting at any given point in time. In the preferred embodiment, output signals 422 and 450 cause the full-wave bridge to cycle between a first current loop in which transistor pairs 424 and 430 or 428 and 426 are activated and a second current loop in which transistors 426 and 430 are activated (transistors 424 and 428 deactivated). The second current loop occurring in the "off" cycle of PWM signals 422 and 450. (In the first current loop, output signal 446 supplies energy to speaker 442 causing energy to be stored in the speaker (inductive portion). When the full-wave bridge is in the second current loop (loop formed by transistors 426 and 430 and speaker 442), the energy stored in the speaker is dissipated by the resistive portion of the speaker. Amplifier 400 can compensate for changes in supply voltage variations (such as via external signal 448) by adjusting the duty cycle of PWM output signals 422 and 450. This is accomplished by adjusting PWM/level shifter circuit 418 when a change in supply voltage level is detected. The amount of duty cycle adjustment being a function of the amount of supply voltage variation.

In a typical pulse-width modulation (PWM) system the PWM Dynamic Range can be determined by the formula:

$$20 \text{ Log} \frac{\tau_{min}}{\tau_{max}}$$

where, $\tau_{max}$ is the maximum duration transistor pairs 424 and 430, or 428 and 426 are on and $\tau_{min}$ is the minimum time the transistor pairs are on for one switching cycle. The present invention modifies the dynamic range of the amplifier to now be determined by the formula:

$$20 \log \left[ a \frac{\tau_{min}}{\tau_{max}} \right]$$

where "a" is the ratio of minimum/maximum discrete voltage level provided by converter 436. Since now the formula is also dependent on variable "a", the dynamic range of the amplifier is increased. The use of a voltage regulator for converter 436 further provides for improvements in distortion by increasing the low level signal resolution with multilevel pulse width modulated digital signals over fixed level PWM designs. This provides for smoother zero voltage crossings from speaker 442 as compared to other audio amplifier systems. In addition, regulator 436 provides isolation from supply voltage variations, due to other circuit loads.

Audio amplification efficiency in amplifier 400 is made independent of the volume setting and the battery supply voltage level without having to use a transformer which adds additional cost to the design. By providing multilevel voltages at 446, the PWM signal "on" duration is maintained at an equal or greater duration then the "off" duration. This keeps the amount of undesired high frequency energy at or below the desired DC component of each PWM signal. The result is that less low pass filtering is required in the circuit to prevent the high frequency energy dissipation and to provide improved efficiency.

Figure 5:
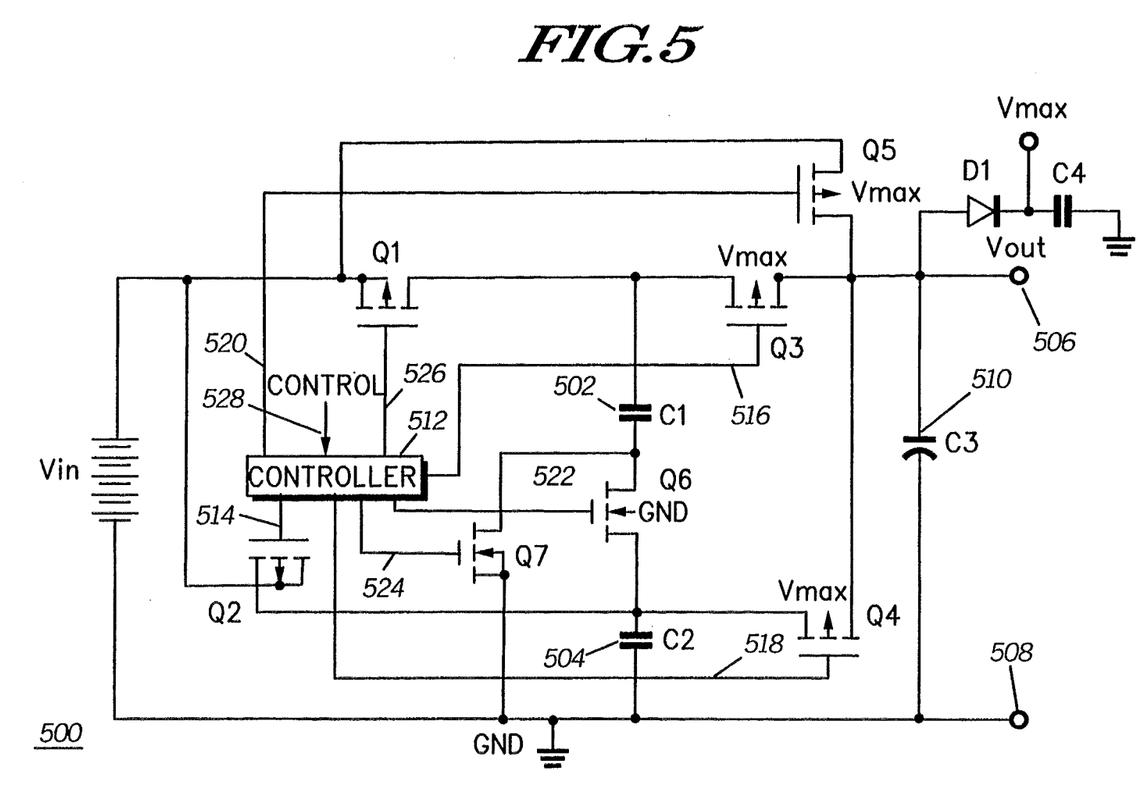
FIG. 5 is a diagram of a voltage converter for use with the amplifier of FIG. 4.

In FIG. 5, a voltage converter 500 for use with the amplifier of FIG. 4 is shown (shown in FIG. 4 as converter 436). Voltage converter 500 provides for a plurality of discrete output voltage levels. In the preferred embodiment, converter 500 provides for three discrete voltage levels. The first output voltage level is set for two times the input voltage level, the second voltage level has the same voltage level as the input voltage, and the third voltage level is equal to half the input voltage.

Controller 512 controls the operation of FETs Q1–Q7 via corresponding control lines 526, 514, 516, 518, 520, 522 and 524. In order to get an output voltage ($V_{OUT}$) across output terminals 506 and 508 which is equal to the $V_{IN}$ voltage, controller 512 turns "off" transistors Q3 516 and Q4, and turns "on" transistor Q5. This in effect places the $V_{IN}$ voltage at the output terminals 506 and 508 (in FIG. 4, the output is shown as line 446). Controller 512 in order to provide an output which is twice the $V_{IN}$ voltage turns transistors Q1, Q2 and Q7 "on" in order to charge capacitors C1 502 and C2 504 in parallel. Once the capacitors are charged, transistors Q1, Q2 and Q7 are turned "off" and transistors Q3 and Q6 are turned "on". Finally, in order to get a $V_{OUT}$ which is half the $V_{IN}$ voltage, transistors Q1 and Q6 are turned "on" until capacitors 502 and 504 are charged in series, then transistors Q1 and Q6 are turned "off" and transistors Q3, Q4, and Q7 are turned "on". The voltage levels provided via output 506 (same as output 446 in FIG. 4) can vary depending on the particular application the voltage converter is to be used in.

Figure 6:
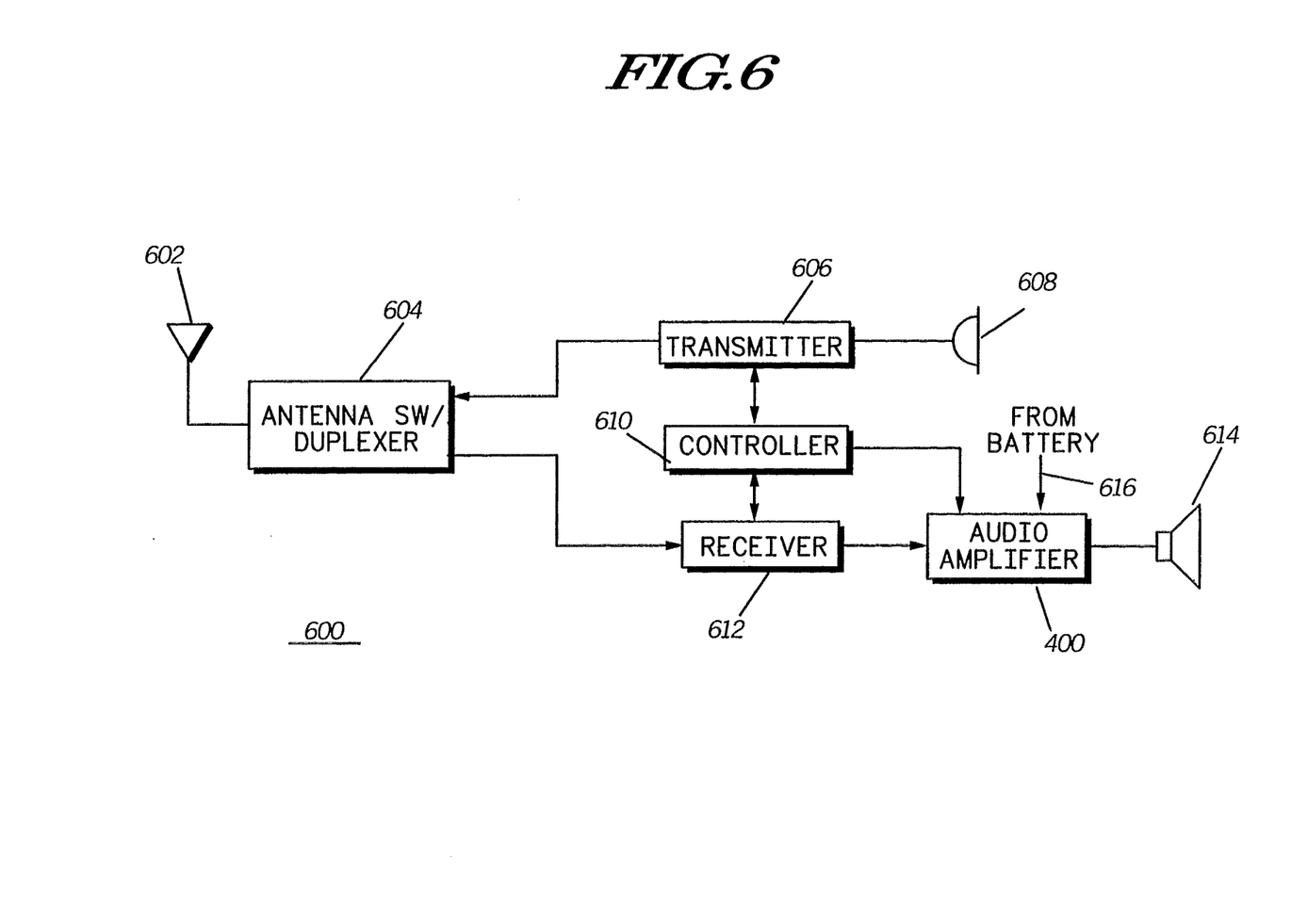
FIG. 6 is a diagram of a radio in accordance with the present invention.

In FIG. 6, there is shown a radio such as a portable two-way frequency radio 600 in accordance with the present invention. Radio 600 includes an antenna 602 which is selectively coupled to a transmitter 606 and receiver 612 via an antenna switch or duplexer 604. Transmitter 606 and receiver 612 are under the control of a controller such as a microcontroller 610 as known in the art. The audio output from receiver 612 is sent to an audio amplifier stage such as amplifier 400 as shown in FIG. 4. Audio amplifier 400 is under the control of controller 610. The radio supply voltage (battery voltage) is also provided to audio amplifier 400. The output of amplifier 400 is then sent to a speaker 614 for presentation.

In summary, the audio amplifier of FIG. 3 provides a continuous variation, in the speaker supply as a function of the desired audio signal A(t) 334. The result is improved efficiency with equivalent dynamic signal range and distortion performance equaling that of linear power amplifiers. Amplifier 300 includes a continuously variable output voltage DC to DC converter with conversion efficiency much better than those found in linear regulators and an output range which can go down close to zero volts. The audio amplifier of FIG. 4 achieves similar efficiency, dynamic range and distortion performance as that found in amplifier 300 while using a simplified multiple discrete output level DC to DC converter and pulse width modulated switching circuit. The pulse width modulated signals are applied to a bridge network setting up the speaker current and providing commutating conditions to sustain the current in the speaker inductance/resistive network during the off portion of the PWM signals. The result is the reduction or total elimination of low pass filtering proceeding the speaker load used in present PWM audio amplifier designs.

What is claimed is:

1. A transformer-less switching audio amplifier, comprising:

a single energy source providing a single supply voltage;

an input terminal for receiving an audio signal;

a voltage converter operating from the single supply voltage, the voltage converter receiving the audio signal and providing a converted output signal which is a function of the magnitude of the audio signal;

a full-wave bridge circuit having a supply terminal for receiving the converted output signal, the full-wave bridge circuit including first and second load terminals for providing the converted output signal to an external load;

a circuit for converting the audio signal into control signals; and the full-wave bridge circuit provides during certain periods of operation a current loop path which allows energy to dissipate through the first and second load terminals but not through the supply terminal in response to the control signals.

2. A switching audio amplifier as defined in claim 1, wherein the converted output signal comprises a continuously variable signal.

3. A switching audio amplifier as defined in claim 1, wherein the converted output signal comprises a multiple discrete output voltage level signal.

4. A switching audio amplifier as defined in claim 1, wherein a speaker is coupled to said first and second load terminals.

5. A switching audio amplifier as defined in claim 4, wherein the circuit for converting the audio signal into control signals includes:
   a conversion means coupled to the input terminal for receiving the audio signal and providing a first output signal which is a positive cycle of the audio signal and a second output signal which is a negative cycle of the audio signal; and
   said conversion means providing the first and second output signals as the control signals for the full wave bridge circuit.

6. A transformer-less switching audio amplifier as defined in claim 5, further comprising:
   a pulse width modulation circuit for pulse width modulating the control signals, said pulse width modulation circuit adjusting the duty cycle of the control signals in response to variations in the single supply voltage.

7. A transformer-less switching audio amplifier, comprising:
   a single energy source providing a single supply voltage;
   an input terminal for receiving an audio signal;
   conversion means coupled to the input terminal for receiving the audio signal and providing a first output signal which is substantially representative of the magnitude of the audio signal, a second output signal which is a positive cycle of the audio signal and a third output signal which is a negative cycle of the audio signal;
   a voltage converter coupled to the conversion means and operating from the single supply voltage, the voltage converter receiving the first output signal and providing a converted output signal which is a function of the first output signal; and
   a full-wave bridge circuit having a first terminal for receiving the converted output signal, a second terminal for receiving the second output signal and a third terminal for receiving the third output signal, the full-wave bridge circuit including first and second load terminals for providing the converted output signal to an external load; and
   the full-wave bridge circuit provides during certain periods of operation a current loop path which allows energy to dissipate through the first and second load terminals but not through the supply terminal in response to the second and third output signals.

8. A switching audio amplifier as defined in claim 7, further comprising a speaker coupled to the full-wave bridge.

9. A switching audio amplifier as defined in claim 7, wherein the voltage converter continuously varies the converted output signal as a function of the audio signal.

10. A switching audio amplifier as defined in claim 7, wherein the converted output signal provided by the voltage converter comprises a multiple discrete output level signal with the level of the converted output signal being a function of the audio signal.

11. A switching audio amplifier as defined in claim 10, wherein the conversion means further comprises an input terminal for receiving a supply voltage and the duty cycle of the second and third output signals are a function of the supply voltage.

12. A switching audio amplifier as defined in claim 7, wherein the full-wave bridge further comprises a series coupled inductive resistive load is coupled between the first and second load terminals which provides filtering to the second and third output signals.

13. A switching audio amplifier as defined in claim 12, wherein the second and third output signals cause the full-wave bridge circuit to cycle between a first current loop in which the first output signal provides energy to the series coupled inductive resistive load and a second current loop in which the energy stored in the inductive portion of the load is dissipated to the resistive portion of the load.

14. A portable radio, comprising:
   a receiver for providing an audio signal; and
   a transformer-less switching audio amplifier, comprising:
      a single voltage source providing a single voltage signal;
      an input terminal for receiving the audio signal;
      a voltage converter operating from the single voltage signal, the voltage converter receiving the audio signal and providing a converted output signal which is a function of the magnitude of the audio signal;
      a full-wave bridge circuit having a supply terminal for receiving the converted output signal, the full-wave bridge circuit including first and second load terminals;
      a speaker coupled to the first and second load terminals and receiving the converted output signal;
      a circuit for converting the audio signal into control signals; and
      the full-wave bridge circuit provides during certain periods of operation a current loop path which allows energy to dissipate through the first and second load terminals but not through the supply terminal in response to the control signals.

15. A portable radio as defined in claim 14, Wherein the converted output signal comprises a continuously variable signal which is a function of the magnitude of the audio signal.

16. A portable radio as defined in claim 14, wherein the converted output signal comprises a multiple discrete output level signal.

17. A transformer-less switching audio amplifier, comprising:
   a single voltage source providing a single supply signal;
   an input terminal for receiving an audio signal;
   a voltage converter operating from the single supply signal, the voltage converter receiving the audio signal and providing a converted output signal which is a function of the magnitude of the audio signal;
   a full-wave bridge circuit having a first supply terminal for receiving the converted output signal and a second supply terminal, the full-wave bridge circuit including first and second load terminals for providing the converted output signal to an external load;
   a circuit providing control signals to the full-wave bridge circuit; and the full-wave bridge circuit provides a current loop path which allows energy to dissipate between the first and second load terminals but does not allow energy to flow between the first and second supply terminals in response to the conhol signals during certain periods of operation.

18. A transformer-less switching audio amplifier as defined in claim 17, Wherein the second supply terminal is coupled to ground potential.

* * * * *